(12) United States Patent
Ishio (10) Patent No.: US 6,694,814 B2
(45) Date of Patent: Feb. 24, 2004

(54) DYNAMIC SENSOR HAVING CAPACITANCE VARYING ACCORDING TO DYNAMIC FORCE APPLIED THERETO

(75) Inventor: Seiichiro Ishio, Kariya (JP)

(73) Assignee: Denso Corporation, Kariya (JP)

( * ) Notice: Subject to any disclaimer, the term of this patent is extended or adjusted under 35 U.S.C. 154(b) by 46 days.

(21) Appl. No.: 10/029,025

(22) Filed: Dec. 28, 2001

(65) Prior Publication Data

US 2002/0104377 A1 Aug. 8, 2002

(30) Foreign Application Priority Data

Feb. 2, 2001 (JP) ........................................ 2001-027440

(51) Int. Cl.$^7$ ............................................ G01P 15/125
(52) U.S. Cl. ................................ 73/514.32; 73/514.38; 73/504.14; 361/283.3
(58) Field of Search ........................ 73/514.16, 514.32, 73/514.38, 514.36, 504.02, 504.03, 862.52, 862.541, 862.68, 862.381, 862.625, 862.626, 504.14; 361/280, 283.3, 281

(56) References Cited

U.S. PATENT DOCUMENTS

| | | | |
|---|---|---|---|
| 6,065,341 A | | 5/2000 | Ishio et al. |
| 6,105,428 A | * | 8/2000 | Schmiesing et al. ..... 73/514.32 |
| 6,151,966 A | * | 11/2000 | Sakai et al. ............... 73/514.32 |
| 6,171,881 B1 | | 1/2001 | Fujii |
| 6,276,207 B1 | * | 8/2001 | Sakai et al. ............... 73/514.16 |
| 6,287,885 B1 | | 9/2001 | Muto et al. |
| 6,360,605 B1 | * | 3/2002 | Pinter et al. ............. 73/514.38 |
| 6,494,096 B2 | * | 12/2002 | Sakai et al. ............... 73/514.32 |

FOREIGN PATENT DOCUMENTS

| | | |
|---|---|---|
| JP | A-6-213924 | 8/1994 |
| JP | A-6-347474 | 12/1994 |
| JP | A-8-219795 | 8/1996 |
| JP | A-11-26778 | 1/1999 |
| JP | A-2000-31502 | 1/2000 |
| JP | A-2001-44450 | 2/2001 |

OTHER PUBLICATIONS

U.S. patent application Ser. No. 09/861,535, Sakai et al., filed May 22, 2001.
U.S. patent application Ser. No. 09/625,860, Sakai et al., filed Jul. 26, 2000.

* cited by examiner

*Primary Examiner*—Helen Kwok
(74) *Attorney, Agent, or Firm*—Posz & Bethards, PLC

(57) ABSTRACT

A dynamic sensor includes stationary electrodes and movable electrodes facing each other and forming a capacitance therebetween. The capacitance changes in accordance with a dynamic force such as acceleration imposed on the sensor. Plural projections are formed on the stationary electrodes to avoid or suppress electrode sticking between the movable electrodes and the stationary electrodes due to an excessive impact imposed on the sensor. The projections are formed to have various heights so that higher projections first hit the movable electrodes and thereby protect lower projections. Even after the higher projections are destroyed by the excessive impact, the lower projections remain intact and serve to prevent the electrode sticking by the excessive impact which may occur later.

10 Claims, 7 Drawing Sheets

DYNAMIC SENSOR HAVING CAPACITANCE VARYING ACCORDING TO DYNAMIC FORCE APPLIED THERETO

CROSS-REFERENCE TO RELATED APPLICATION

This application is based upon and claims benefit of priority of Japanese Patent Application No. 2001-27440 filed on Feb. 2, 2001, the content of which is incorporated herein by reference.

BACKGROUND OF THE INVENTION

1. Field of the Invention

The present invention relates to a capacitor-type dynamic sensor, especially to its electrodes and flexible beam structure.

2. Description of Related Art

A capacitor-type dynamic sensor is composed of stationary electrodes and movable electrodes that face the stationary electrodes forming a small air gap therebetween. A dynamic force applied to the sensor, such as acceleration, is detected by changes of a capacitance formed between both electrodes. When an excessive impact is applied to such a conventional sensor, the movable electrodes contact the stationary electrodes, and thereby both electrodes may stick to each other. To suppress such a sticking phenomenon, JP-A11-326365 proposes to form plural projections on the stationary electrodes. Since the movable electrodes contact the stationary electrodes via such projections when an excessive impact is applied to the sensor, a contacting area of both electrodes is decreased and the sticking force therebetween is also decreased.

However, since the projections are uniformly positioned on the stationary electrodes in the dynamic sensor proposed, all the projections may be destroyed at the same time when an excessive impact is imposed. If all the projections are destroyed, the sticking of both electrodes cannot be avoided.

SUMMARY OF THE INVENTION

The present invention has been made in view of the above-mentioned problem, and an object of the present invention is to provide an improved dynamic sensor, in which the sticking between the movable and stationary electrodes is avoided.

Stationary electrodes and movable electrodes are formed on a semiconductor substrate, so that the movable electrodes face the stationary electrodes with a small air gap therebetween. A capacitance which is variable according to a dynamic force such as acceleration imposed on the dynamic sensor is formed between the stationary electrodes and the movable electrodes. The changes in capacitance are taken out from the sensor as electrical signals, and the dynamic force imposed on the sensor is detected based on the electrical signals.

The movable electrodes tend to stick to the stationary electrodes when both electrodes contact each other due to an excessive impact imposed on the sensor. To avoid or suppress the electrode sticking, plural projections are formed on either the movable electrodes or on the stationary electrodes or on both electrodes. Those projections decrease an area of contact between both electrodes when both electrodes contact each other by an excessive impact. The projections are formed to have various heights so that the higher projections first hit the other electrode thereby to protect lower projections. The lower projections thus protected serve to prevent the electrode sticking which is otherwise caused by the next excessive impact.

The stationary electrodes are supported on the semiconductor substrate at one end thereof, forming a cantilever structure. The movable electrodes are connected at one end thereof to a center rod which is anchored on the semiconductor substrate at its both ends, the movable electrodes also forming a cantilever structure. Due to the cantilever structure of both electrodes, the electrode sticking is most likely to occur at the tip portion and foot portion of the cantilever structure. Therefore, the projections are more densely positioned either at the tip portion or at the foot portion of the cantilever-structured electrodes or at both the tip and foot portions than at a center portion thereof. Further, higher projections are formed at the tip or the foot portions, or at both portions.

It is preferable to form the projections on the stationary electrodes to avoid a dynamic unbalance of the movable electrodes which may occur when some of the projections formed on the movable electrodes are destroyed by an excessive impact. The projections may be formed on both sides of the stationary electrodes facing the movable electrodes to further securely avoid the electrode sticking.

The projections may be made on a flexible beam that swings back and force according to a dynamic force applied thereto. Such projections are made so that the projections restrict an excessive swinging motion of the flexible beam before the movable electrodes contact the stationary electrodes.

The sticking between the moving electrodes and the stationary electrodes is avoided or suppressed by the projections formed according to the present invention, and dynamic sensor can be operated for a long time.

Other objects and features of the present invention will become more readily apparent from a better understanding of the preferred embodiment described below with reference to the following drawings.

DETAILED DESCRIPTION OF THE PREFERRED EMBODIMENT

Figure 1A:
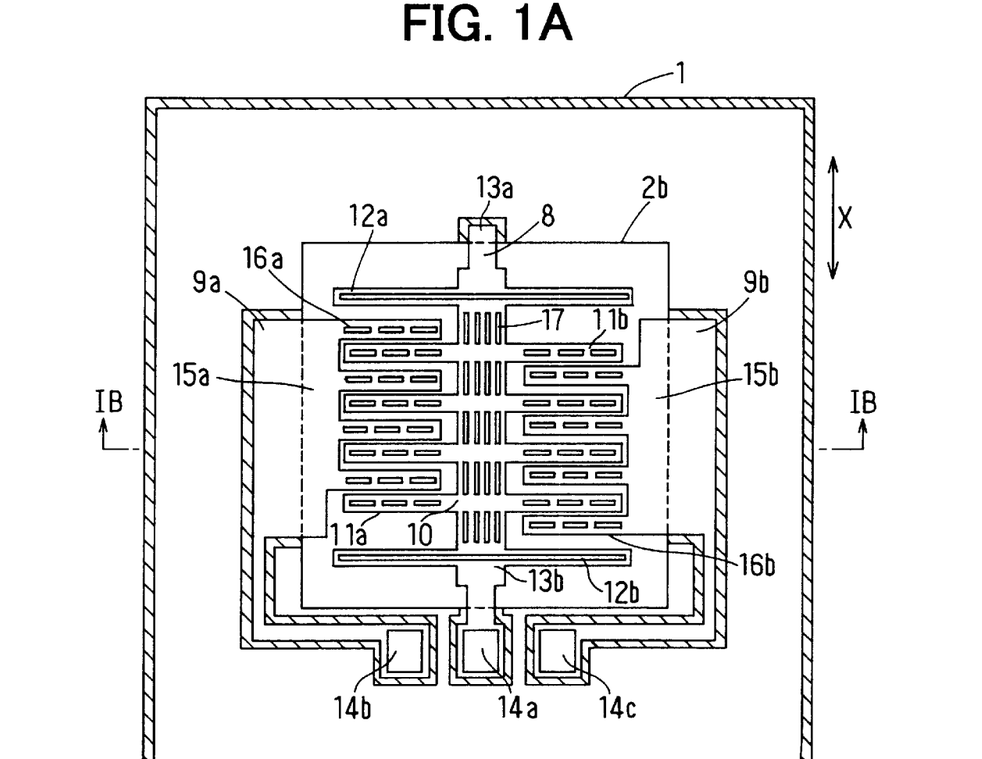
FIG. 1A is a plan view showing a capacitor-type acceleration sensor.
Figure 1B:
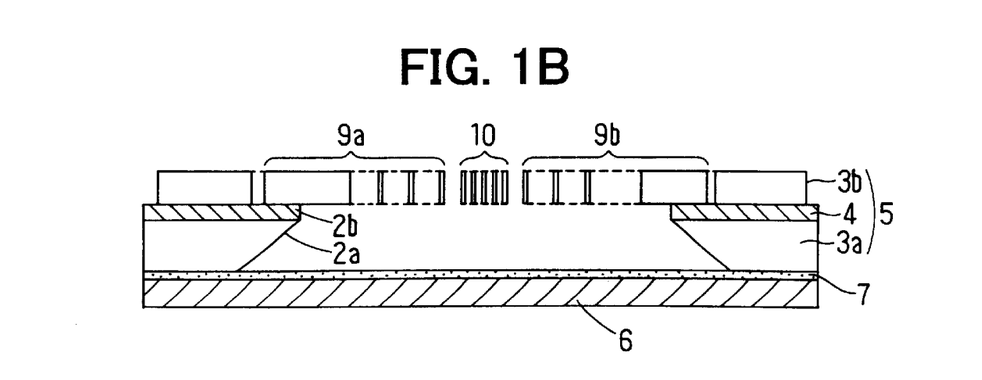
FIG. 1B is a cross-sectional view showing the capacitor-type acceleration sensor, taken along line IB—IB in FIG. 1A.

A preferred embodiment of the present invention will be described with reference to FIGS. 1A–5B. First, referring to FIGS. 1A and 1B, an entire structure of a capacitor-type acceleration sensor will be described. An acceleration sensor 1 is formed on a silicon-on-insulator (SOI) substrate 5 having a first semiconductor layer 3a made of single crystal silicon, an oxidized layer 4 ($SiO_2$) and a second semiconductor layer 3b made of single crystal silicon, those layers being laminated in this order as shown in FIG. 1B. After plural sensor chips are formed on the SOI substrate 5, the SOI substrate 5 is pasted on a base plate 6 with adhesive 7. Then, the plural sensor chips are separated into individual chips by dicing. Details of the manufacturing process will be described later.

As shown in FIG. 1B, an opening 2a is formed through the first semiconductor layer 3a, and an opening 2b is formed through the oxidized layer 4. Acceleration sensor elements including a first stationary member 9a, a second stationary member 9b and a movable member 8 are formed on the second semiconductor layer 3b so that portions of the elements are positioned above the openings 2a and 2b, as shown in FIGS. 1A and 1B. The first and second stationary members 9a, 9b and the movable member 8 are formed on the second semiconductor layer 3b by making trenches reaching the oxidized layer 4.

The movable member 8 is composed of a center rib 10, a pair of flexible beams 12a, 12b and movable electrodes 11a, 11b extending to both sides of the center rib 10. The center rib 10 serves as a weight of the movable member 8 and is anchored on the second semiconductor layer 3b at anchor portions 13a, 13b formed at both ends of the center rib 10. The movable electrodes 11a, 11b are elongate rod-shaped and extend perpendicularly from the center rib 10. The rod-shaped movable electrode 11a, 11b has a rectangular cross-section. Each flexible beam 12a, 12b functions as a spring that swings back and forth in direction X (shown in FIG. 1A) according to an external acceleration force applied to the movable member 8 in that direction.

A pad 14a for electrically connecting the movable member 8 to an outside circuit is formed on the second semiconductor layer 3b at a position outside the opening 2b. The pad 14a is made of aluminum.

The first stationary member 9a is composed of a first connecting portion 15a and first stationary electrodes 16a perpendicularly extending from the first connecting portion 15a. The connecting portion 15a is formed on the second semiconductor layer 3b fixed to the first semiconductor layer 3a via the oxidized layer 4. The first stationary electrodes 16a are positioned above the opening 2b in a cantilever manner, forming a comb-like shape. Each of the first stationary electrode 16a has a rectangular cross-section. The first stationary electrodes 16a are positioned so that each stationary electrode 16a faces each movable electrode 11a with a small air gap therebetween, as shown in FIG. 1A. In other words, the stationary electrode 16a and the movable electrode 11a facing each other form a capacitor that detects acceleration imposed on the acceleration sensor 1. The air gap between both electrodes 16a and 11a changes according to the acceleration imposed, and thereby a capacitance formed between both electrodes changes.

Similarly, the second stationary member 9b is composed of a second connecting portion 15b and second stationary electrodes 16b perpendicularly extending from the second connecting portion 15b. The connecting portion 15b is formed on the second semiconductor layer 3b fixed to the first semiconductor layer 3a via the oxidized layer 4. The second stationary electrodes 16b are positioned above the opening 2b in a cantilever manner, forming a comb-like shape. Each of the second stationary electrode 16b has a rectangular cross-section. The second stationary electrodes 16b are positioned so that each stationary electrode 16b faces each movable electrode 11b with a small air gap therebetween, as shown in FIG. 1A. In other words, the stationary electrode 16b and the movable electrode 11b facing each other form a capacitor that detects acceleration imposed on the acceleration sensor 1. The air gap between both electrodes 16b and 11b changes according to the acceleration imposed, and thereby a capacitance formed between both electrodes changes.

A pad 14b for electrically connecting the first stationary member 9a to an outside circuit is formed on the second semiconductor layer 3b which is fixed to the first semiconductor layer 3a via the oxidized layer 4. Similarly, a pad 14c for electrically connecting the second stationary member 9b to the outside circuit is formed on the second semiconductor layer 3b. Both pads 14b and 14c are made of aluminum.

In the acceleration sensor 1 structured as described above, a first capacitance CS1 (shown in FIG. 5A) is formed between the first stationary electrodes 16a and the movable electrode 11a, and a second capacitance CS2 (shown in FIG. 5A) is formed between the second stationary electrodes 16b and the movable electrode 11b. When an acceleration force is imposed on the center rod 10 functioning as a weight, the air gap between the movable electrodes 11a, 11b and the stationary electrodes 16a, 16b changes, and thereby the first capacitance CS1 and the second capacitance CS2 change accordingly. The amount of the acceleration imposed on the sensor 1 is detected as a difference between CS1 and CS2 in the manner described later in detail.

Plural through-holes 17 are formed on the center rod 10 to enhance mechanical strength and to decrease the weight of the center rod. Similarly, the through-holes 17 are also formed on both the movable electrodes 11a, 11b and the stationary electrodes 16a, 16b.

Figure 2A:
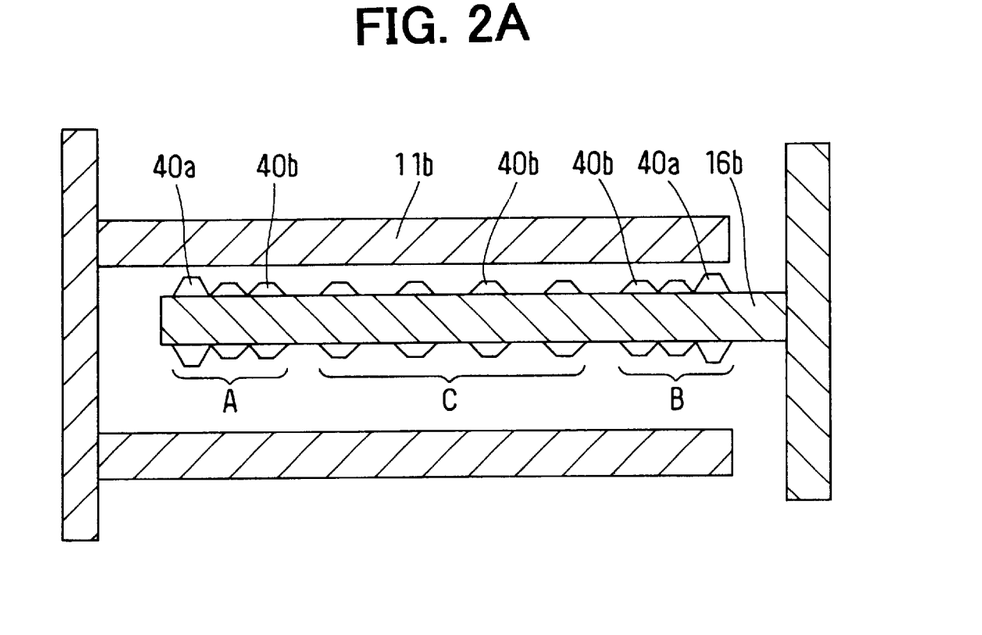
FIG. 2A is a plan view showing an electrode structure as an embodiment of the present invention in an enlarged scale.

Now, an electrode structure according to the present invention will be described with reference to FIG. 2A. Since the right side electrodes and the left side electrodes are symmetrically structured as shown in FIG. 1A, only the right side structure is shown in FIG. 2A. In FIG. 2A, the second stationary electrode 16b faces the movable electrode 11b with a small air gap therebetween. On both sides of the second stationary electrode 16b, plural projections 40a, 40b are formed integrally with the second stationary electrode 16b. In this particular example shown in FIG. 2A, a high projection 40a and low projections 40b are formed at the tip portion A and the foot portion B of the second stationary electrode 16b, while the low projections 40b are formed at the center portion C. The projections 40a, 40b may be formed so that they become gradually higher toward the tip portion and the foot portion. Further, a large number of projections are formed at the tip portion A and the foot portion B, while a small number of projections are formed at the center portion. In other words, the projections are densely positioned at both the tip portion A and the foot portion B, while they are sparsely positioned at the center portion. On the first stationary electrode 16a, the projections 40a, 40b are formed in the same manner as those of the second stationary electrode 16b.

When the movable electrodes 11a, 11b and the stationary electrodes 16a, 16b are excessively displaced by a high impact imposed thereon, the high projections 40a first hit the movable electrodes 11a, 11b and they are first destroyed by the hitting impact. The low projections 40b are protected by the high projections 40b and remain intact even after the high projections 40a are destroyed. Therefore, the sticking force between the movable electrodes 11a, 11b and the stationary electrodes 16a, 16b is alleviated by the remaining low projections 40b, and the electrode sticking can be avoided or suppressed.

The excessive displacement of the electrodes may occur in manufacturing processes or transportation of the sensor 1. However, most of the sticking problem occur when an excessive impact is imposed on the sensor 1 during its actual use. Since the movable electrodes 11a, 11b have a cantilever structure supported by the center rod 10, an amount of displacement is large at the tip portion which faces the foot portion B of the stationary electrodes 16a, 16b. Also, the stationary electrodes 16a, 16b have a cantilever structure supported by the connecting portions 15a, 15b. Therefore, an amount of displacement is large at the tip portion A. To cope with the large amount of displacement occurring at both tip portions of the movable electrodes and the stationary electrodes, the projections 40a, 40b are densely positioned at the tip portion A and the foot portion B of the stationary electrodes 16a, 16b, compared with those at the center portion C. If some of the densely positioned projections 40a, 40b are destroyed by the excessive impact, the electrode sticking is suppressed by remaining projections.

Further, since the projections 40a, 40b are formed on both sides of the stationary electrodes 16a, 16b, the electrode sticking is suppressed not only at the capacitor-forming side but also at the other side of the stationary electrodes 16a, 16b.

Figure 3A:
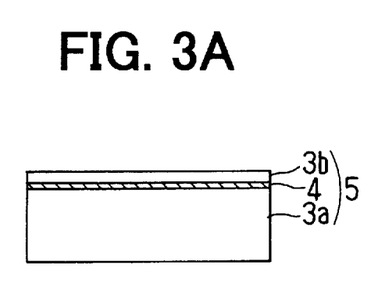
FIGS. 3A–3F are cross-sectional views schematically showing a process of manufacturing the acceleration sensor.
Figure 3B:
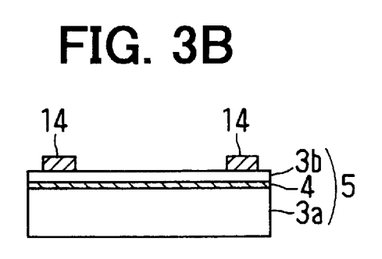

A process of manufacturing the acceleration sensor 1 will be described with reference to FIGS. 3A–3F. First, the SOI substrate 5 having the first semiconductor layer 3a, the oxidized layer 4 and the second semiconductor layer 3b as shown in FIG. 3A is prepared. Then, as shown in FIG. 3B, a pad-forming process is performed. A thin aluminum layer covering an entire surface of the second semiconductor layer 3b is formed by vapor deposition. Then, the thin aluminum layer is patterned into a form of pads 14 (14a, 14b and 14c) through a photolithography process and an etching process. Sintering is performed to obtain an ohmic contact of the pads 14, if necessary. Then, a rear surface of the first semiconductor layer 3a is flattened by machining or grinding to obtain a proper thickness of the first semiconductor layer 3a. If the second semiconductor layer 3a is too thick, a process for making the opening 2a requires a longer time.

Figure 3C:
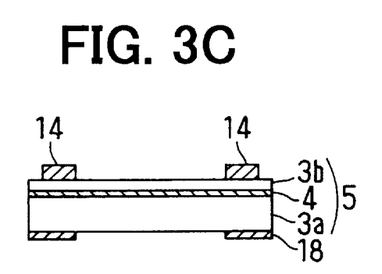

Then, as shown in FIG. 3C, a mask-forming process is performed. A silicon nitride layer covering the entire rear surface of the second semiconductor layer 3a is formed by a plasma CVD method or the like. Then, the silicon nitride layer is patterned into a mask 18 that is used for forming the opening 2a through a photolithography process and an etching process. The mask 18 may be made of a silicon nitride layer, a silicon oxide layer or a resist layer.

Figure 3D:
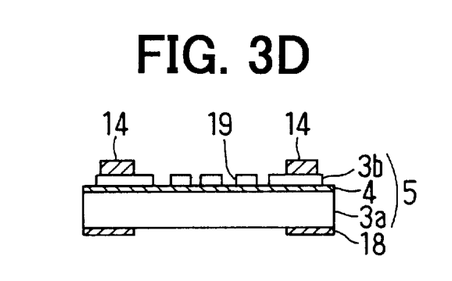

Then, as shown in FIG. 3D, a trench-forming process is performed. A layer, which is resistive against dry-etching, covering the surface of the second semiconductor layer 3b and the pads 14 is formed. The layer may be made of a resist layer, a silicon oxide layer or a silicon nitride layer. The resistive layer is patterned into a predetermined pattern corresponding to the sensor elements such as the movable member 8 and the stationary members 9a, 9b. Then, the second semiconductor layer 3b is processed under anisotropic dry-etching to form various trenches corresponding to the sensor elements, using the resistive layer as a mask. The trenches are formed through the second semiconductor layer 3b, so that they reach the oxidized layer 4. The trenches also include the rectangular through-holes 17 on the center rod 10, the movable electrodes 11a, 11b and the stationary electrodes 16a, 16b. In this trench-forming process, the projections 40a, 40b are formed integrally with the stationary electrodes 16a, 16b.

Figure 3E:
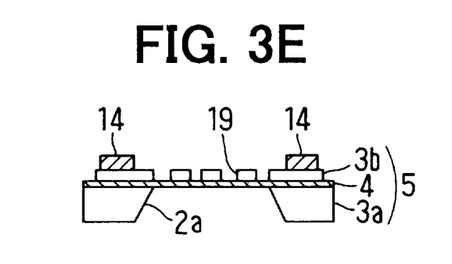

Then, as shown in FIG. 3E, a first etching process is performed. The opening 2a is formed through the first semiconductor layer 3a under anisotropic etching, using an aqueous solution such as a KOH solution. The mask 18 formed in the process shown in FIG. 3C is used as a mask for forming the opening 2a. The etching time is controlled so that the first semiconductor layer 3a is etched up to the surface of the oxidized layer 4 and the oxidized layer 4 is not damaged by the etching. In other words, the etching time is determined by calculation based on an etching rate of the etching solution and the thickness of the first semiconductor layer 3a. The mask 18 is removed after the first etching process is completed.

Figure 3F:
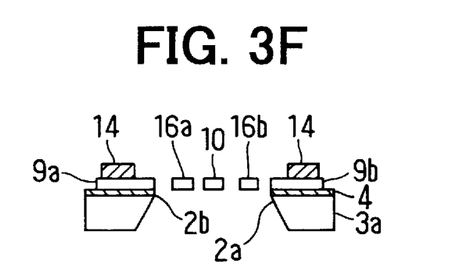

Then, as shown in FIG. 3F, a second etching process is performed. The oxidized layer 4 is etched under dry-etching to remove portions of the oxidized layer 4 and to form the opening 2b through the oxidized layer 4. By forming the opening 2b, the flexible beams 12a, 12b, the movable electrodes 11a, 11b and the center rod 10 of the movable member 8 are made movable relative to the second semiconductor layer 3b, while the center rod 10 are supported at its both ends on the second semiconductor layer 3b. Also, the stationary electrodes 16a, 16b of the stationary members 9a, 9b are made movable, forming cantilever structures supported by the connecting portions 15a, 15b which are fixed to the second semiconductor layer 3b.

After the second etching process is completed, the SOI substrate 5 having plural sensor chips formed thereon is pasted on the base plate 6 with adhesive 7. Then, the substrate is diced into individual sensor chips, thus forming the acceleration sensor 1.

Now, operation of the capacitor-type acceleration sensor 1 will be described with reference to FIGS. 4A–5B. When acceleration including a component in direction X shown in FIG. 1A is imposed on the sensor 1, the center rod 10 (functioning as a weight) supported by both flexible beams 12a, 12b displaces. The amount of the displacement is determined by the weight of the center rod 10, resiliency of the flexible beams 12a, 12b, and an electrostatic force between the movable electrodes 11a, 11b and the stationary electrodes 16a, 16b. The electrostatic force is generated when a voltage is supplied to those electrodes.

Figure 4A:
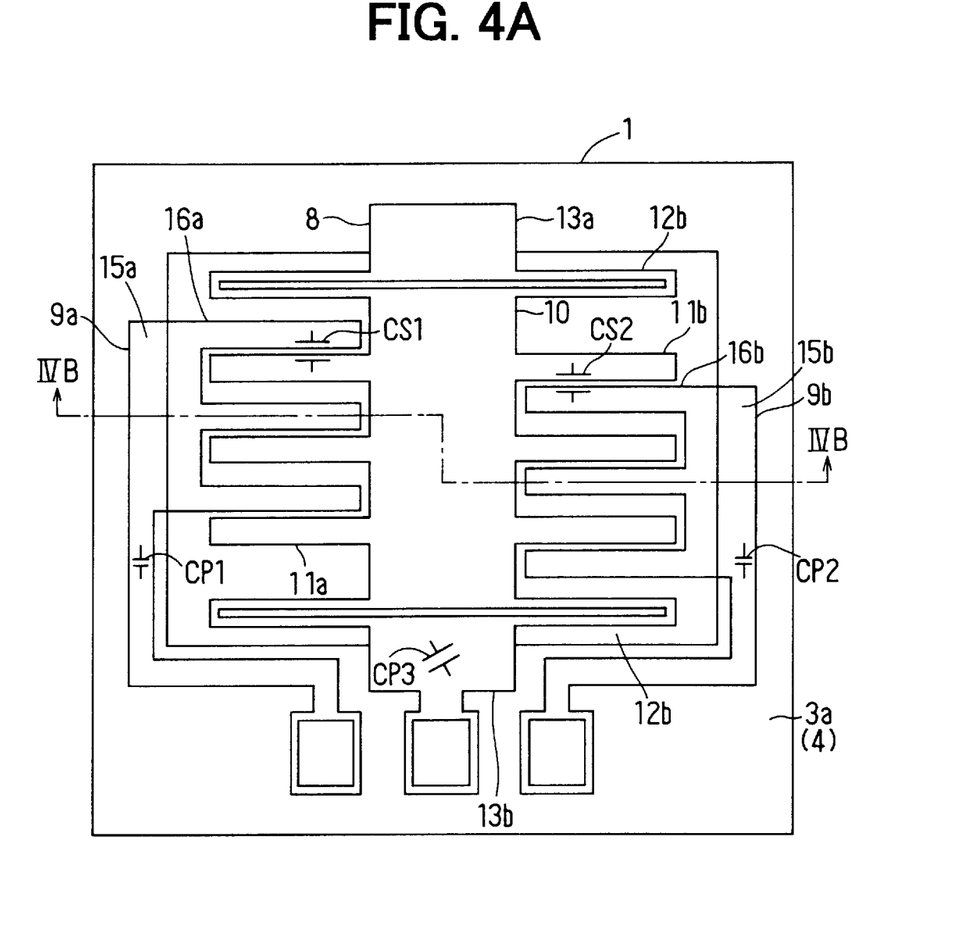
FIG. 4A is a plan view showing formation of capacitors in the acceleration sensor.
Figure 4B:
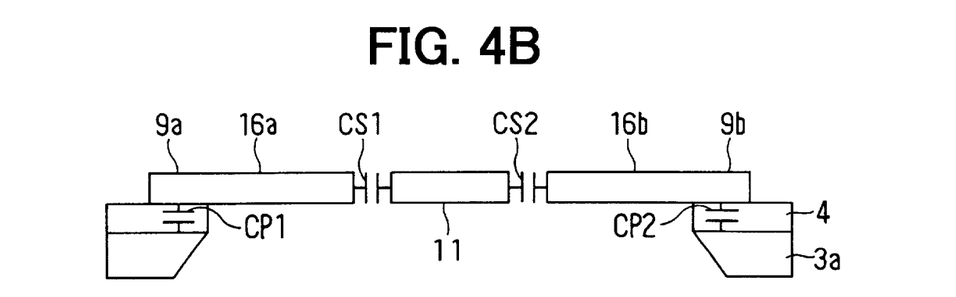
FIG. 4B is a cross-sectional view showing formation of capacitors in the acceleration sensor, taken along line IVB—IVB in FIG. 4A.

As shown in FIGS. 4A and 4B, a first capacitor CS1 is formed between the movable electrodes 11a and the first stationary electrodes 16a, and a second capacitor CS2 is formed between the movable electrodes 11b and the second stationary electrodes 16b. The capacitance of both capacitors CS1 and CS2 differentially varies in accordance with the amount of displacement of the movable electrodes 11a, 11b. That is, as the capacitance of the first capacitor CS1 increases, the capacitance of the second capacitor CS2 decreases. Such changes in capacitance are taken out as electrical signals through the pads 14a, 14b and 14c. The amount of acceleration imposed on the sensor 1 is detected based on the changes in capacitance. Since the left side electrodes and the right side electrodes are symmetrically positioned, the capacitance of the first capacitor CS1 is the same as that of the second capacitor CS2 when no acceleration is imposed on the sensor 1.

In addition to the first and the second capacitors CS1, CS2, stray capacitors CP1, CP2, and CP3 are formed as shown in FIGS. 4A and 4B. That is, the stray capacitor CP1 is formed between the first connecting portion 15a and the first semiconductor layer 3a. The stray capacitor CP2 is formed between the second connecting portion 15b and the first semiconductor layer 3a. The stray capacitor CP3 is formed between the anchor portion 13b and the first semiconductor layer 3a.

Figure 5A:
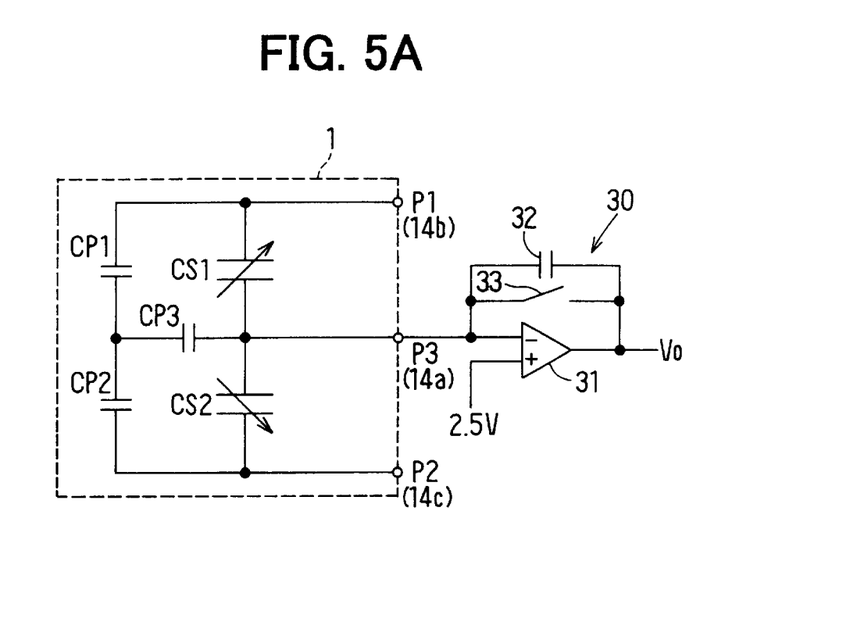
FIG. 5A is a diagram showing a circuit for detecting a capacitance in the acceleration sensor.
Figure 5B:
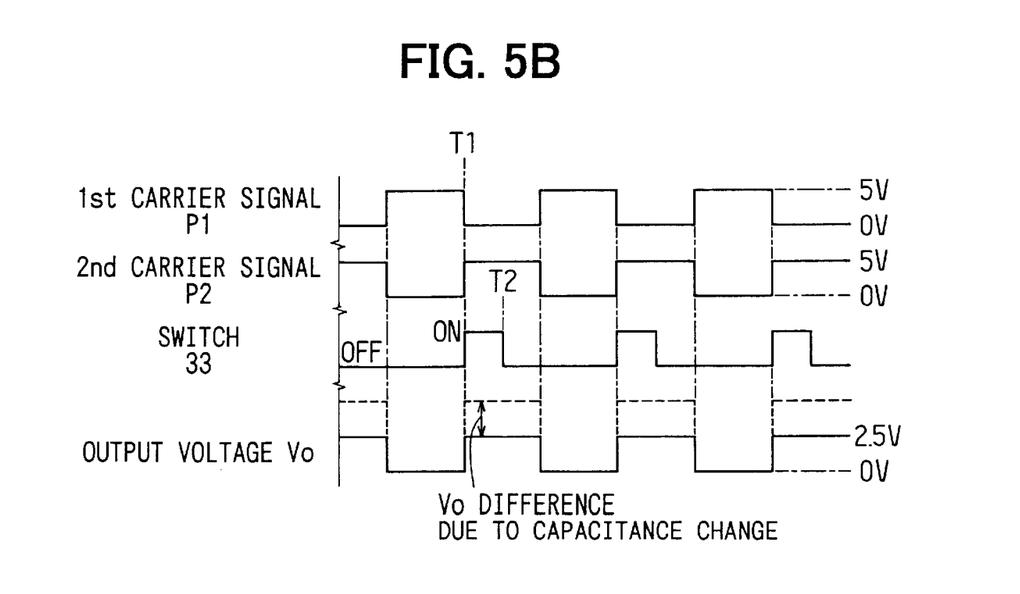
FIG. 5B is a diagram showing various waveforms in the circuit shown in FIG. 5A.

Referring to FIGS. 5A and 5B, a circuit for detecting changes in capacitance and its operation will be explained. The sensor 1 is shown in FIG. 5A as an equivalent circuit. A first carrier signal P1 having a rectangular 10 waveform shown in FIG. 5B (e.g., 100 KHz, 5 volts) is supplied to the pad 14b connected to the first stationary electrodes 16a. A second carrier signal P2 having a phase 180-degree different from the first carrier signal P1 (e.g., 100 KHz, 5 volts) is supplied to the pad 14c connected to the second stationary electrodes 16b. Both carrier signals are generated in synchronism with a clock signal from an oscillator (not shown). The voltage level of the pad 14a connected to the movable electrodes 11a, 11b changes according to capacitance of both capacitors CS1 and CS2.

The voltage level of pad 14a is detected by a switched capacitor circuit 30 shown in FIG. 5A. The switched capacitor circuit 30 includes an operational amplifier 31, a feedback capacitor 32 and a switch element 33 connected as shown in FIG. 5A. A signal from the pad 14a (a signal showing a voltage level of the movable electrodes 11a, 11b) is fed to an inverse input terminal of the operational amplifier 31, while a voltage at a level of 2.5 volts (which corresponds to a voltage level appearing at the pad 14a when the capacitance CS1 is equal to the capacitance CS2) is fed to a non-inverse input terminal of the operational amplifier 31.

The switch element 33 is turned on and off by a trigger signal generated in synchronism with a clock signal from an oscillator (not shown). As shown in FIG. 5B, the switch element 33 is turned on at time T1 in synchronism with a falling edge of the first carrier signal P1 only for a predetermined period (T1 to T2) which is shorter than half a period of the first carrier signal P1.

The detecting circuit operates in the following manner. When capacitance CS1 is equal to capacitance CS2 (when no acceleration is imposed), zero volt is supplied to the first stationary electrodes 16a, 5 volts to the second stationary electrodes 16b, and 2.5 volts to the movable electrodes 11a, 11b, respectively, at time T1 shown in FIG. 5B. Since the switch element 33 is turned on at time T1, an output voltage Vo from the switched capacitor circuit 30 becomes 2.5 volts. When the switch element 33 is turned off at time T2, the output voltage Vo remains unchanged because the voltage levels at the stationary electrodes 16a, 16b also remain unchanged if no acceleration is imposed.

On the other hand, when acceleration is imposed on the sensor 1, the output voltage Vo varies according to a capacitance difference between CS1 and CS2, i.e., an amount of acceleration imposed. Therefore, the amount of acceleration is detected based on the output voltage Vo. The output voltage Vo is expressed in the following formula:

$$Vo = \{(CS1-CS2)+(CP1-CP2) \cdot CP3\} \cdot V/Cf,$$

where V is a voltage difference between the first stationary electrodes 16a and the second stationary electrodes 16b, and Cf is a capacitance of the feedback capacitor 32.

Figure 2B:
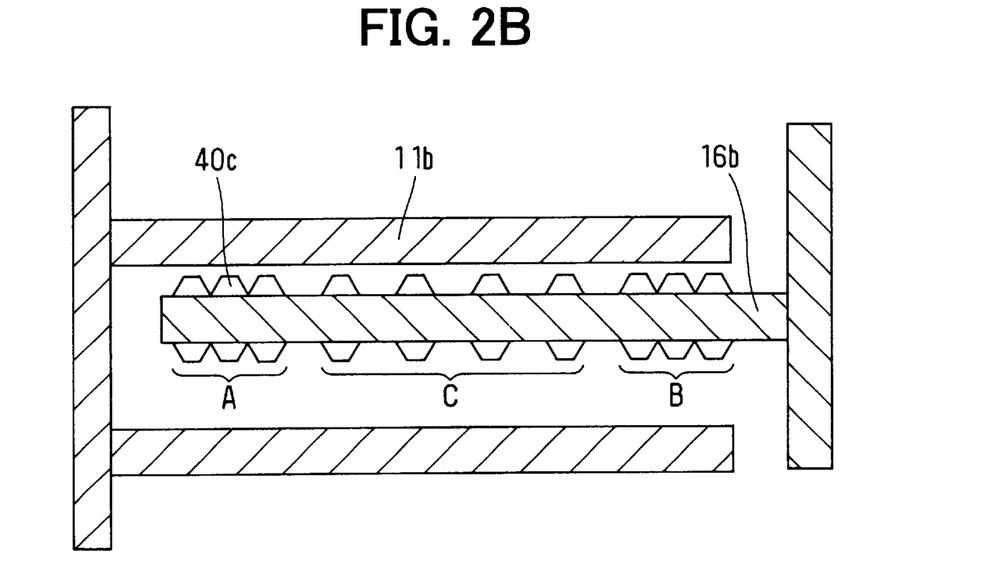
FIG. 2B is a plan view showing another exemplary electrode structure in an enlarged scale.

The present invention is not limited to the embodiment described above, but it may be variously modified. For example, the shape of the projections 40 (40a and 40b) formed on the stationary electrodes 16a, 16b is not limited to a trapezoidal shape. It may be formed in other shapes such as a conical shape. The number of the projections 40 may be variously chosen, considering their strength. Though the height of the projections is changed according to their positions in the example shown in FIG. 2A, the projections may be formed to have a uniform height (projections 40c) as shown in FIG. 2B. However, it is preferable to form the projections 40 as shown in FIG. 2A to avoid a situation where all the projections 40 are destroyed by an excessive impact.

It is also possible to form the projections 40 on the movable electrodes 11a, 11b instead of forming them on the stationary electrodes 16a, 16b. It is preferable, however, to form them on the stationary electrodes 16a, 16b to avoid an unbalance of the movable electrodes which may occurs when some projections are destroyed by an excessive impact.

Figure 6:
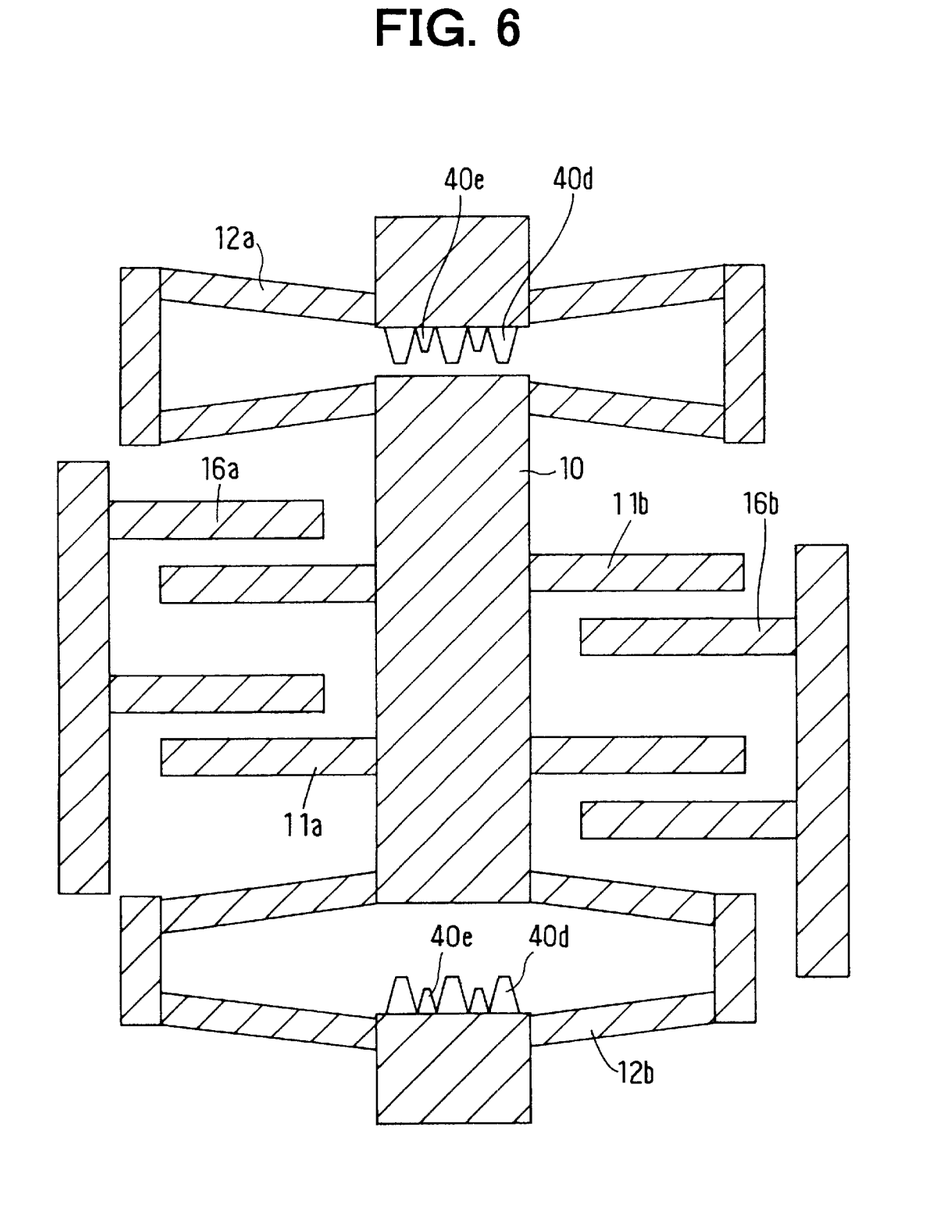
FIG. 6 is a plan view showing an example of an electrode structure, in which projections are formed on flexible beams of a movable member.

Further, as shown in FIG. 6, the projections 40d, 40e may be formed on the flexible beams 12a, 12b, instead of forming them on the stationary electrodes 16a, 16b. In this case, the height of the projections 40d, 40e has to be set so that the projections contact the center rib 10 before the movable electrodes 11a, 11b contact the stationary electrodes 16a, 16b when an excessive impact is imposed on the sensor 1. The electrode sticking can be avoided by the projections 40d, 40e formed on the flexible beams 12a, 12b. It is preferable to form the high projections 40d and the low projections 40e to protect the low projections 40e by the high projections 40d.

Figure 7:
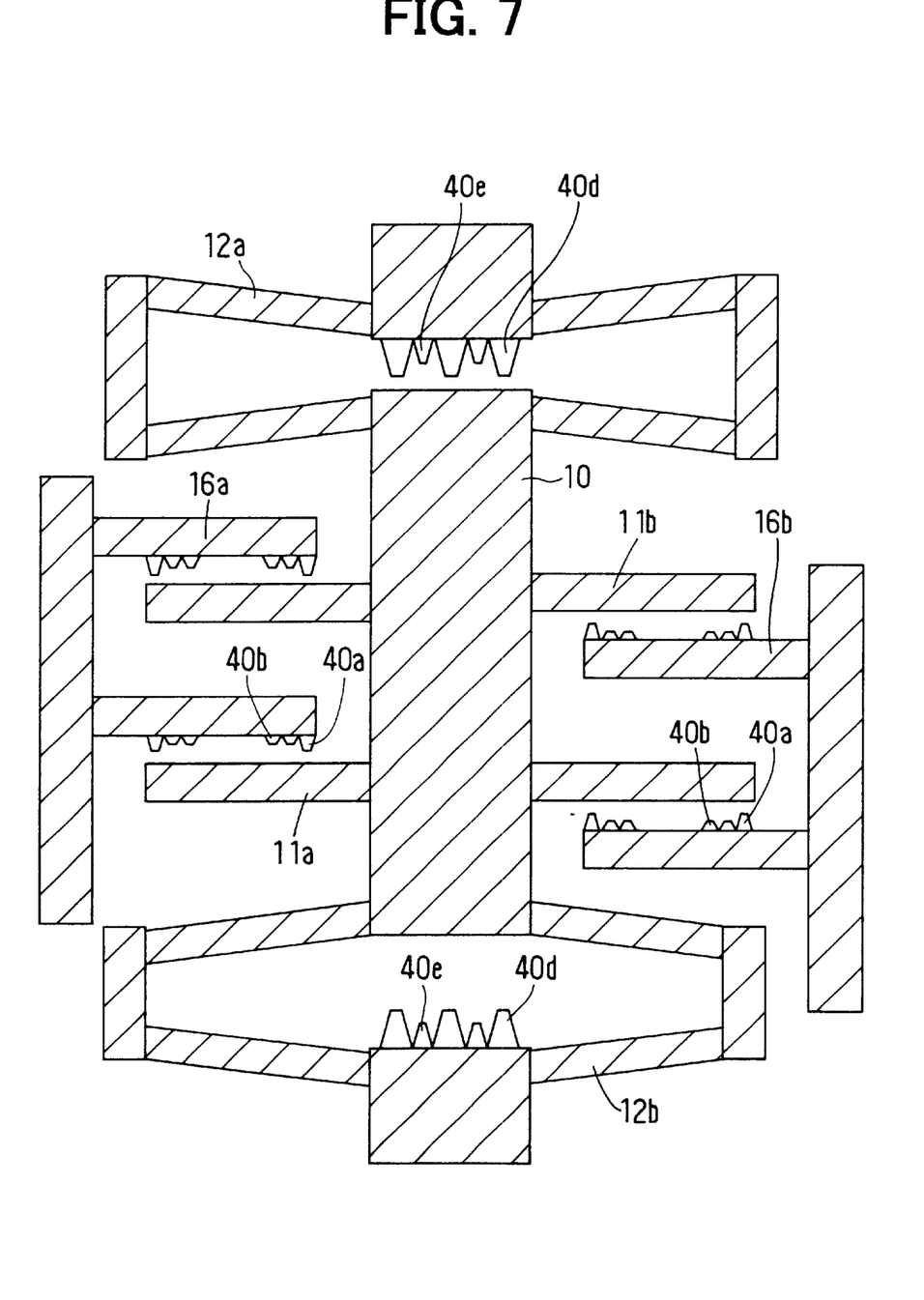
FIG. 7 is a plan view showing another example of an electrode structure, in which projections are formed on flexible beams of a movable member and on stationary electrodes of a stationary member.

It is also possible to form the projections on both the flexible beams 12a, 12b and the stationary electrodes 16a, is 16b, as shown in FIG. 7. The projections 40d, 40e on the flexible beams 12a, 12b have to be formed so that they first contact the center rib 10 before the projections 40a, 40b on the stationary electrodes 16a, 16b contact the movable electrodes 11a, 11b. It is preferable to form the high projections 40a, 40d and the low projections 40b, 40e in this case, too, to further securely prevent the electrode sticking.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A dynamic sensor comprising:
   a semiconductor substrate;
   a stationary member formed on the semiconductor substrate, the stationary member having elongate stationary electrodes;
   a movable member anchored on the semiconductor substrate, the movable member having elongate movable electrodes facing the stationary electrodes and forming a capacitance therebetween which varies according to a dynamic force applied to the movable electrodes, wherein:
   a plurality of projections are formed on either the stationary electrodes or the movable electrodes, or on both the stationary electrodes and the movable electrodes, the projections having various heights so that the highest ones of the projections first hit ones of the stationary electrodes and/or the movable electrodes facing the projections when an excessive dynamic force is applied to the dynamic sensor.

2. The dynamic sensor as in claim 1, wherein:

the elongate stationary electrodes are supported on the semiconductor substrate at one end thereof, forming cantilevers;

the movable member includes an elongate center rib anchored on the semiconductor substrate at both ends thereof; and the elongate movable electrodes are connected to the center rib at one end thereof, forming cantilevers.

3. The dynamic sensor as in claim 2, wherein:

the projections are formed on the stationary electrodes.

4. The dynamic sensor as in claim 3, wherein:

the projections are more densely positioned either at a tip portion or at a foot portion of each of the stationary electrodes, or at both the tip portion and the foot portion, than at a center portion thereof.

5. The dynamic sensor as in claim 3, wherein:

the projections are made higher either at a tip portion or at a foot portion of each of the stationary electrodes, or at both the tip portion and the foot portion, than at a center portion thereof.

6. The dynamic sensor as in claim 3, wherein:

the projections are formed on both sides of the stationary electrodes.

7. A dynamic sensor comprising:

a semiconductor substrate;

a stationary member formed on the semiconductor substrate, the stationary member having elongate stationary electrodes;

a movable member anchored on the semiconductor substrate, the movable member having elongate movable electrodes facing the stationary electrodes and forming a capacitance therebetween which varies according to a dynamic force applied to the movable electrodes, wherein:

the elongate stationary electrodes are supported on the semiconductor substrate at one end thereof, forming cantilevers;

the movable member includes an elongate center rib and a flexible beam resiliently swinging according to a dynamic force applied to the dynamic sensor, the elongate center rib being anchored on the semiconductor substrate at both ends thereof, the elongate movable electrodes being connected to the center rib, forming cantilevers; and a plurality of projections for restricting an excessive swinging motion of the flexible beam are formed on the flexible beam, wherein the projections formed on the flexible beam have various heights so that highest ones of the projections first restrict the excessive swinging motion of the flexible beam.

8. The dynamic sensor as in claim 7, wherein:

a plurality of projections are formed on the stationary electrodes so that the projections hit the movable electrodes when an excessive impact is imposed on the dynamic sensor.

9. The dynamic sensor as in claim 8, wherein:

the projections formed on the stationary electrodes have various heights so that the highest projections first hit the movable electrodes when the excessive impact is imposed on the dynamic sensor.

10. The dynamic sensor as in claim 8, wherein:

the projections formed on the stationary electrodes are positioned more densely either at a tip portion or at a foot portion of the stationary electrodes forming the cantilevers, or at both the tip portion and the foot portion, than at a center portion thereof.

* * * * *